(12) United States Patent
Sekine et al.

(10) Patent No.: US 9,950,496 B2
(45) Date of Patent: Apr. 24, 2018

(54) MULTI-LAYER PREFORM SHEET

(71) Applicant: NAPRA CO., LTD., Katsushika-Ku, Tokyo (JP)

(72) Inventors: Shigenobu Sekine, Tokyo (JP); Chihiro Shimaya, Tokyo (JP)

(73) Assignee: Napra Co., Ltd., Tokyo (JP)

( * ) Notice: Subject to any disclaimer, the term of this patent is extended or adjusted under 35 U.S.C. 154(b) by 2 days.

(21) Appl. No.: 15/342,358

(22) Filed: Nov. 3, 2016

(65) Prior Publication Data
US 2018/0009194 A1 Jan. 11, 2018

(30) Foreign Application Priority Data
Jul. 5, 2016 (JP) .................................. 2016-133101

(51) Int. Cl.
*B22F 1/02* (2006.01)
*B32B 15/01* (2006.01)
*H01B 1/02* (2006.01)

(52) U.S. Cl.
CPC ............. *B32B 15/01* (2013.01); *H01B 1/026* (2013.01); *Y10T 428/12181* (2015.01); *Y10T 428/12715* (2015.01)

(58) Field of Classification Search
None
See application file for complete search history.

(56) References Cited

U.S. PATENT DOCUMENTS

| | | | | |
|---|---|---|---|---|
| 5,520,752 A | * | 5/1996 | Lucey, Jr. ............ | B23K 35/262 148/400 |
| 2004/0074952 A1 | * | 4/2004 | Stipp .................... | B23K 1/0016 228/245 |
| 2004/0112478 A1 | * | 6/2004 | Bieler .................. | B23K 35/262 148/538 |
| 2007/0089811 A1 | | 4/2007 | Ikeda et al. | |
| 2011/0068149 A1 | * | 3/2011 | Hirano .................... | B22F 1/025 228/56.3 |
| 2011/0171372 A1 | * | 7/2011 | Shearer ..................... | B22F 3/10 427/123 |
| 2014/0048942 A1 | | 2/2014 | Nakamura et al. | |
| 2014/0174605 A1 | * | 6/2014 | Nakagawa ................ | B22F 1/00 148/24 |
| 2014/0345939 A1 | | 11/2014 | Nakano et al. | |
| 2015/0054158 A1 | | 2/2015 | Sekine et al. | |

(Continued)

FOREIGN PATENT DOCUMENTS

| JP | 2002-301588 A | 10/2002 |
|---|---|---|
| JP | 2005-052873 A | 3/2005 |

(Continued)

OTHER PUBLICATIONS

Extended European search report issued in the corresponding European patent application 16197691.5 dated Jun. 21, 2017.

*Primary Examiner* — Seth Dumbris
(74) *Attorney, Agent, or Firm* — Carrier Blackman & Associates, P.C.; Joseph P. Carrier; Anne G. Sabourin

(57) ABSTRACT

A multi-layer preform sheet having at least a first layer and a second layer, the first layer being composed of a solder material that contains an intermetallic compound, and the second layer containing a first metal having a melting point of 300° C. or above, and a second metal capable of forming an intermetallic compound with the first metal.

1 Claim, 5 Drawing Sheets

(56) References Cited

U.S. PATENT DOCUMENTS

| | | |
|---|---|---|
| 2015/0097300 A1 | 4/2015 | Sekine |
| 2016/0012931 A1* | 1/2016 | Das ........................ H01B 1/02 |
| | | 252/513 |
| 2016/0158897 A1* | 6/2016 | Koroki ................... B23K 35/26 |
| | | 148/24 |

FOREIGN PATENT DOCUMENTS

| | | |
|---|---|---|
| JP | 2007-152418 A | 6/2007 |
| JP | 2007-268569 A | 10/2007 |
| JP | 4401281 B2 | 1/2010 |
| JP | 2011-167714 A | 9/2011 |
| JP | 2012-050993 A | 3/2012 |
| JP | 2014-063846 A | 4/2014 |
| JP | 5517694 B2 | 6/2014 |
| JP | 2014-180690 A | 9/2014 |
| JP | 2015-124434 A | 7/2015 |
| JP | 2015-174097 A | 10/2015 |
| WO | 2009/066825 A1 | 5/2009 |
| WO | 2016/027593 A1 | 2/2016 |

\* cited by examiner

MULTI-LAYER PREFORM SHEET

CROSS-REFERENCE TO RELATED APPLICATIONS

This application is based on the Japanese Patent Application No. 2016-133101, filed on Jul. 5, 2016, the entire content of which is incorporated hereinto by reference.

TECHNICAL FIELD

This invention relates to a multi-layer preform sheet.

First, the terms used in this specification will be defined as follows:

(1) the term "metal", "metal particle" or "metal component" is used for indicating not only a simple metal element, but also an alloy composed of two or more metal elements, a composite structure, or, a combination of them;

(2) "nanometer" denotes a range of dimension below 1 μm (1000 nm); and (3) "metal matrix" denotes a metal or alloy that serves as a base material for filling up the gaps around, and supporting, other ingredients.

BACKGROUND ART

In devices such as those kept operated at high temperatures for a long duration of time, and operated under harsh environments such as exposed to large temperature changes between operational states at high temperatures and idle states at low temperatures, represented by vehicle-borne power control devices (power devices), bonding portions are required to be able to keep high bonding strength over a long duration of time. None of the conventionally known bonding members has, however, been enough to satisfy such requirement.

For example, a SnAgCu-based bonding member (powdery solder material) disclosed in JP-A-2007-268569 cannot satisfy the above-described requirement at all.

As a technique of enhancing heat resistance or bonding strength of the bonding portion, there has been known a method of increasing the content of a refractory metal contained in the bonding member, or increasing the amount of an intermetallic compound to be formed. The bonding member with such high content of refractory metal, however, needs higher temperatures for bonding, and this may cause damages in substrates and electronic parts. Meanwhile, in the strategy of increasing the amount of intermetallic compound to be formed, a metal that should principally be allocated to diffusion in conjunction with a member to be bonded would be consumed to form the intermetallic compound, and this may make the bonding incomplete.

There is still another problem of reduced mechanical strength caused by Kirkendall void. The Kirkendall void is generated when atomic vacancies (lattice defects), generated as a result unbalanced mutual diffusion of metals, accumulate rather than annihilate. For an exemplary case of a Sn—Cu interface, vacancies accumulate at the interface between an intermetallic compound and Cu, since Sn diffuses only to a lesser extent than Cu does, to thereby form the Kirkendall void. The Kirkendall void may grow up to a larger void or crack, may degrade reliability and quality of the bonding portion or the three-dimensional structure, may further reduce the mechanical strength, and can even result in separation, breakage, chipping or the like.

Japanese patent No. 5517694 has disclosed a method of forming a Ni layer on a member to be bonded, allowing $Cu_6Sn_5$ to deposit or migrate thereon to form a barrier layer, thereby suppressing growth of a compound layer due to a reaction at the bonding interface, and associated formation of voids.

The deposition or migration of $Cu_6Sn_5$ to the bonding interface, however, takes a certain time, and also during that time the reaction-diffusion process proceeds. It is therefore not always possible to suppress the Kirkendall void from generating.

PRIOR ART DOCUMENTS

Patent Document

Patent Document 1: JP-A-2007-268569
Patent Document 2: Japanese Patent No. 5517694

SUMMARY OF INVENTION

Problems to be Solved by the Invention

It is therefore an object of the this invention to provide a multi-layer preform sheet that is able to form a highly reliable and high-quality electric interconnect, an electro-conductive bonding portion or the like that is less likely to produce the Kirkendall void.

It is another object of this invention to provide a multi-layer preform sheet that is able to form a highly heat-resistant, highly reliable and high-quality electric interconnect, an electro-conductive bonding portion or the like.

Measures for Solving the Problem

The multi-layer preform sheet of this invention, aimed at solving the above-described problems, includes at least a first layer and a second layer. The first layer is a bonding member that contains an intermetallic compound, and the second layer contains a first metal and a second metal. The first metal is a metal or alloy having a melting point of 300° C. or above, and the second metal is a metal or alloy capable of forming an intermetallic compound with the first metal.

In the multi-layer preform sheet of this invention, the first layer is a bonding member that contains an intermetallic compound. By properly selecting an ingredient of the bonding member, the multi-layer preform sheet may be bonded to a member to be bonded, without damaging substrates, electronic parts or the like.

Bonding using a conventional solder material has resulted in generation of the Kirkendall void at the bonding interface, since the member to be bonded and the solder material have been brought into direct contact.

In contrast, the first layer preliminarily contains an intermetallic compound. Since the intermetallic compound is laid as a barrier layer between the member to be bonded and the bonding member, the rates of diffusion of metals are suppressed. This consequently suppresses the unbalanced mutual diffusion of metals, or excessive growth of a compound layer due to diffusion, and thereby the Kirkendall void is suppressed from generating.

The multi-layer preform sheet of this invention additionally has the second layer. The second layer contains the first metal that is a metal or alloy having a melting point of 300° C. or above, and the second metal that is a metal or alloy capable of forming an intermetallic compound with the first metal.

As a result of formation, during bonding, of an intermetallic compound between the first metal and the second metal, the bonding portions will have an enhanced bonding strength. Since the first metal has a melting point of 300° C. or above, the intermetallic compound is heat-resistant, and the bonding portions to be formed again will be highly heat-resistant. With the first metal only having a melting point below 300° C., a required level of heat resistance is hardly attainable.

The first layer may be a bonding member containing at least 2% by weight of an intermetallic compound of Cu and Sn. The second layer contains the first metal and the second metal, wherein the first metal can contain Cu, and the second metal can contain Sn. Operations and effects derived from this configuration will be detailed later by referring to embodiments.

The metal component of the multi-layer preform sheet of this invention is configured by a metal element selected from the group consisting of Cu, Al, Ni, Sn, Ag, Au, Pt, Pd, Si, B, Ti, Bi, In, Sb, Ga, Zn, Fe, Ge, Mn, Cr and Co.

When used for bonding, the multi-layer preform sheet of this invention, which is configured to have the first layer and the second layer, may be bonded at the melting point causing no damage in the substrates or electronic parts, and can elevate the re-melting temperature after solidified up to the melting point of the intermetallic compound formed in the second layer. The multi-layer preform sheet can therefore form a highly heat-resistant, highly reliable, and high-quality bonding portion or conductor portion. The multi-layer preform sheet characterized as such is advantageous when intended for use as an electro-conductive bonding member for configuring semiconductor devices for power control (power devices) that produce a large amount heat.

By properly controlling the ratio of contents of the first metal and the second metal in the second layer, or the bonding temperature or bonding time, it also becomes possible to fill up the gaps around the intermetallic compound portions to be formed with a metal matrix. The metal matrix has a higher toughness than the intermetallic compound has. The bonding portion formed by using the multi-layer preform sheet of this invention can therefore have both of good levels of heat resistance ascribable to the intermetallic compound, and a high flexibility ascribable to the metal matrix. The bonding portion can therefore keep high levels of heat resistance, bonding strength and mechanical strength over a long duration of time, even if the devices were kept operated at high temperatures for a long duration of time, or operated under harsh environments such as exposed to large temperature changes between operational states at high temperatures and idle states at low temperatures.

The second layer may also contain an intermetallic compound. As a result of containing an intermetallic compound prior to bonding, it now becomes possible to suppress the rates of diffusion of the first metal and the second metal in the second layer even when heated for bonding, and to suppress generation of the Kirkendall void.

As described above, the multi-layer preform sheet of this invention is configured to have at last two layers of preform sheet with a variety of compositions, structures, operations and effects. With such configuration, it is now possible to solve problems regarding damages in substrates and electronic parts, and bonding failure due to shortage of bonding member. For example, the individual sheets may be assigned with specialized operations and effects, such that the first layer is given as a preform sheet that takes part in enhancing bonding with a member to be bonded, the second layer is given as a preform sheet that takes part in enhancing strength of the bonding portion, and the third layer is given as a preform sheet that takes part in enhancing heat dissipation. The multi-layer preform sheet can consequently improve its function as a whole.

Having described the advantages when applied as a bonding member, the multi-layer preform sheet of this invention is not only suitable for this application, but also for an electric interconnect or a laminated circuit board.

Advantages of the Invention

As has been described above, it is now possible according to this invention to provide a multi-layer preform sheet capable of forming an electric interconnect, an electro-conductive bonding portion and so forth that are highly reliable, have high quality, and are less likely to produce the Kirkendall void.

It is also possible to provide a multi-layer preform sheet capable of forming an electric interconnect, an electro-conductive bonding portion and so forth that are highly heat resistant, highly reliable, and have high quality.

BEST MODE FOR CARRYING OUT THE INVENTION

Figure 1:
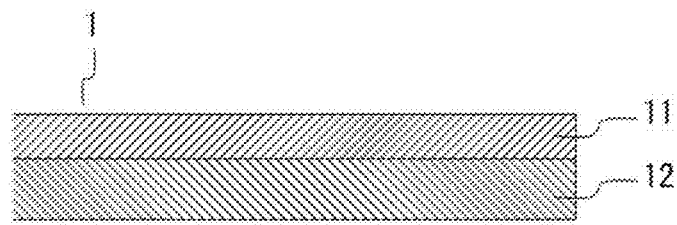
FIG. 1 is a schematic drawing illustrating an exemplary multi-layer preform sheet of this invention.

A preferred embodiment will be explained referring to FIG. 1. A multi-layer preform sheet 1 has at least a first layer 11 and a second layer 12. The first layer 11 is a bonding member that contains an intermetallic compound. The content of the intermetallic compound in the first layer 11 is preferably, but not limited to, 2% by weight to 50% by weight. The bonding member is mainly composed of a metal or alloy that can melt at a temperature causing no damage in substrates and electronic parts, and can bond with a member to be bonded based on a reaction-diffusion process.

The second layer 12 contains a first metal and a second metal. The first metal is a metal or alloy whose melting point is 300° C. or above, and may additionally contain an intermetallic compound. The second metal is a metal or alloy capable of forming an intermetallic compound with the first metal, and may additionally contain an intermetallic compound. Assuming the total weight of the first metal and the second metal as 100% by weight, the content of the first metal is preferably, but not limitatively, in the range from 1% by weight to 80% by weight.

Figure 2:
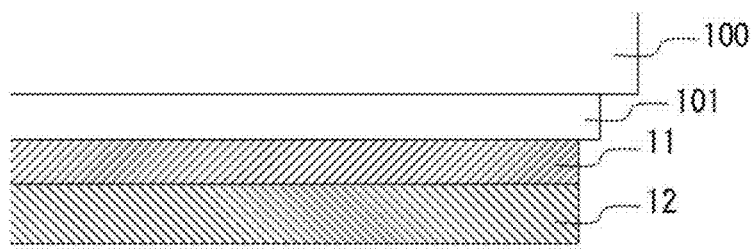
FIG. 2 is a schematic drawing illustrating an exemplary state of bonding of the multi-layer preform sheet of this invention.

The first layer 11 is bonded to a member to be bonded 101 that is formed on a substrate 100 based on the reaction-diffusion process (see FIG. 2).

Figure 3:
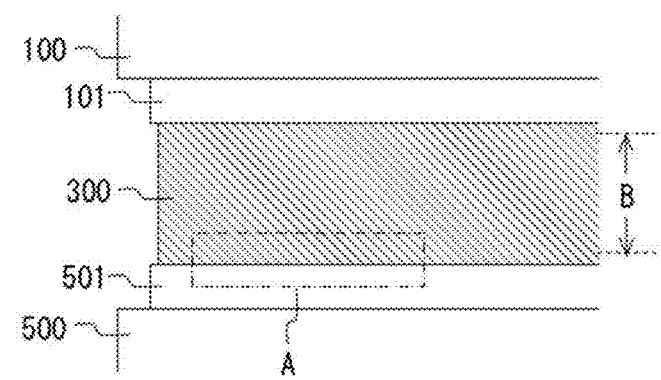
FIG. 3 is a schematic drawing illustrating an exemplary bonding portion formed with the multi-layer preform sheet of this invention.

Referring now to FIG. 3, the multi-layer preform sheet 1 bonds, for example, members to be bonded 101, 501 that are respectively formed on the substrate 100 and a substrate 500 that are opposed to each other. The bonding portion 300 is obtained by using the multi-layer preform sheet 1. The substrates 100, 500 are typically substrates that configure electronic/electric devices such as power device, on which the members to be bonded 101, 501 are formed in the form of electrode, bump, terminal, lead conductor or the like. In the electronic/electric devices such as power device, the members to be bonded 101, 501 are typically, but not limitatively, composed of Cu or an alloy thereof. This invention shall not preclude any article that has a portion, corresponded to the substrates 100, 500, composed of a metal/alloy body.

Figure 4:
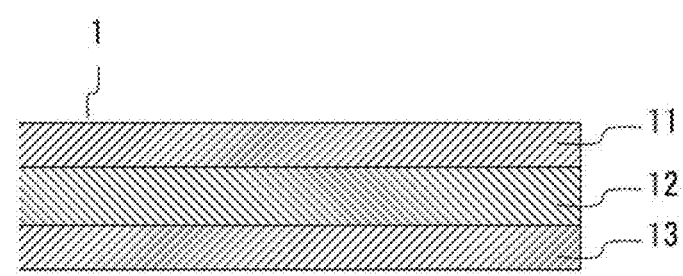
FIG. 4 is a schematic drawing illustrating an exemplary embodiment of the multi-layer preform sheet of this invention.

Another preferred embodiment will be explained referring to FIG. 4. The first layer 11 is a bonding member that contains an intermetallic compound, and more specifically, mainly composed of an alloy of Sn or Sn alloy. The intermetallic compound is $Cu_xSn_y$ (mainly $Cu_6Sn_5$) composed of Sn and Cu, wherein the content of which is approximately 20% by weight. The second layer 12 contains the first metal and the second metal, wherein the first metal is Cu or Cu alloy, meanwhile the second metal is Sn or Sn alloy. The Cu content in the second layer 12 is approximately 40% by weight. A third layer 13 is a bonding member that contains an intermetallic compound, having the structure and configuration exactly same as those of the first layer 11, and is bonded to a member to be bonded based on the reaction-diffusion process.

Figure 5:
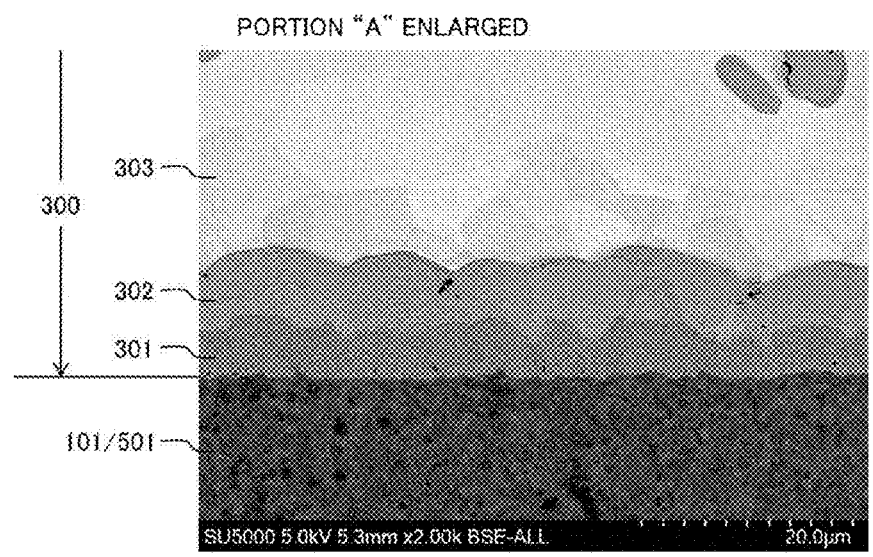
FIG. 5 is a SEM image of portion "A" in FIG. 3.
Figure 6:
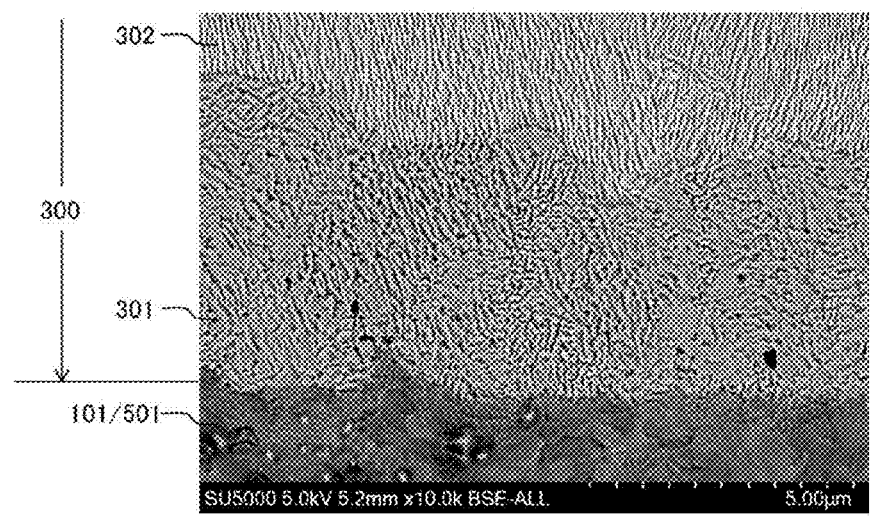
FIG. 6 is an enlarged view of the SEM image in FIG. 5.

FIG. 5 and FIG. 6 are SEM images showing an exemplary structure at around the bonding interface between the multi-layer preform sheet 1 and the member to be bonded. FIG. 5 is a SEM image of portion "A" in FIG. 3, and FIG. 6 is an enlarged view of FIG. 5. Each of the members to be bonded 101, 501 is a Cu or Cu alloy layer. The bonding portion 300 is obtained by using the multi-layer preform sheet illustrated in FIG. 4. Time and temperature necessary for bonding are properly selectable depending on structures or configurations of the multi-layer preform sheet and the member to be bonded, within the ranges where substrates and electronic parts are unlikely to be damaged. In this embodiment, the temperature was elevated stepwise, and then kept at 280° C. for 1 to 20 minutes.

The bonding portion 300 is configured to have a layer 301, a layer 302, and a layer 303 stacked in this order on the surface of each of the members to be bonded 101, 501. The intermetallic compound contained in the layer 301 is mainly $Cu_3Sn$, meanwhile the intermetallic compound contained in the layer 302 is mainly $Cu_6Sn_5$.

It is seen in FIG. 5 that the intermetallic compound layer is suppressed from excessively growing, and thereby the bonding portion is formed, accompanied by only a small amount of void. This is because there is a barrier layer, composed of intermetallic compound $Cu_xSn_y$ contained in the first layer 11, laid between the bonding member mainly composed of Sn or Sn alloy contained in the first layer 11, and each of the members to be bonded 101, 501 mainly composed of Cu, and thereby the rates of diffusion of metals were suppressed. As a consequence, unbalanced mutual diffusion such that Sn can diffuse only to a lesser extent than Cu can may be corrected, and thereby the Kirkendall void may be prevented from occurring. In this way, it now becomes possible to form a highly reliable and high-quality bonding portion that has a high mechanical strength, and is less likely to cause separation, breakage, chipping or the like.

Figure 10:
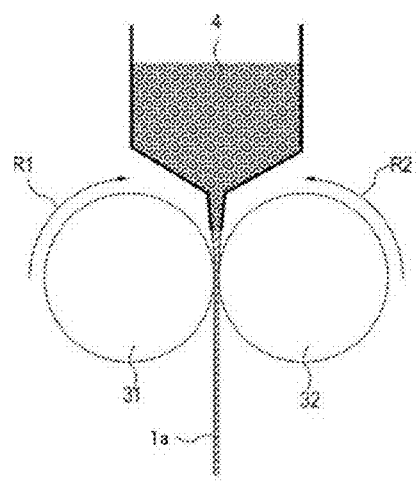
FIG. 10 is a schematic drawing illustrating a method of manufacturing a single preform sheet based on rolling.

A preform sheet of the first layer 11, when manufactured according to the method illustrated in FIG. 10 (described later), will yield further better results, if every particle of metal powder 4 to be employed is a metal particle having an intermetallic compound. If so, the intermetallic compound that configures a barrier layer can be dispersed throughout the first layer 11 rather than being segregated, and this certainly brings the barrier layer and the members to be bonded 101, 501 into direct contact to each other. This consequently enhances an effect of suppressing the rates of diffusion.

The intermetallic compound contained in the layer 301 and the layer 302 may have a band structure. As seen in FIG. 6, the intermetallic compound contained in the layer 301 and the layer 302 forms the band structure that is typified by a stripe structure or lamellar structure having the band structures aligned at intervals.

The Kirkendall void, should it occur, will no more grow beyond the point where it reaches the band structure of the intermetallic compound. Since the band structure has nano-sized intervals, so that the Kirkendall void can grow only within a narrow range, and will not grow up to serious defects such as cracks. It therefore becomes possible to form a highly reliable and high-quality bonding portion having a large mechanical strength, and is less likely to cause separation, breakage, chipping or the like.

The layer 301 and the layer 302 may further contain a metal matrix. The metal matrix in this embodiment is specifically an alloy having intermixed therein Sn, Sn alloy and so forth. The metal matrix has a higher toughness than the intermetallic compound has. The layer 301 and the layer 302 may therefore have both of good levels of heat resistance and strength ascribable to the intermetallic compound, and a high flexibility ascribable to the metal matrix. The bonding portion can therefore keep high levels of heat resistance, bonding strength and mechanical strength over a long duration of time, even if the devices were kept operated at high temperatures for a long duration of time, or operated under harsh environments such as exposed to large temperature changes between operational states at high temperatures and idle states at low temperatures.

The multi-layer preform sheet 1 additionally has the second layer 12. The second layer 12 contains the first metal and the second metal, wherein the first metal is Cu or a Cu alloy, meanwhile the second metal is Sn or a Sn alloy. The second layer 12 forms therein an intermetallic compound represented by $Cu_xSn_y$ (typically $Cu_3Sn$ and $Cu_6Sn_5$) during bonding. $Cu_3Sn$ having a melting point of approximately 676° C., and $Cu_6Sn_5$ having a melting point of approximately 435° C. can fuse as a result of bonding, and can elevate the re-melting temperature after solidified.

Gaps around the thus formed intermetallic compound portions may be filled up with a metal matrix, by properly controlling the ratio of contents of the first metal and the second metal, or, the temperature or time of bonding. The metal matrix in this embodiment is specifically an alloy having intermixed therein Sn, Sn alloy and so forth. The metal matrix has a higher toughness than the intermetallic compound has. The bonding portion can therefore have both of good levels of heat resistance and strength ascribable to the intermetallic compound, and a high flexibility ascribable to the metal matrix. The bonding portion can therefore keep high levels of heat resistance, bonding strength and mechanical strength over a long duration of time, even if the devices were kept operated at high temperatures for a long duration of time, or operated under harsh environments such as exposed to large temperature changes between operational states at high temperatures and idle states at low temperatures.

The second layer 12 may also preliminarily contain an intermetallic compound. Under heating during bonding, the first metal and the second metal undergo a reaction-diffusion process in the second layer 12. If such intermetallic compound were not preliminarily contained, the Kirkendall void would occur as a result of the reaction-diffusion process. In contrast, if the intermetallic compound is preliminarily added to the second layer 12 prior to the bonding, there will be observed an effect of suppressing the rate of diffusion, and of suppressing the Kirkendall void from generating.

It is further possible to form the bonding portion having still higher levels of heat resistance and bonding strength at high temperatures, by composing the second metal using an alloy that is obtainable by preliminarily forming or dispersing an intermetallic compound in a metal particle. The second metal may be manufactured by applying a technique disclosed in JP-B2-4401281, describing that a pulverization chamber is fed with an atmospheric gas at room temperature, and that a dish-like disk is preferably rotated at a rotating speed of 30,000 rpm or above. This technique was further investigated in this invention. The pulverization chamber, although fed with the atmospheric gas at room temperature, was actually found to be heated up to 80° C. or around. The present inventors then kept the inner temperature of the pulverization chamber at 40° C. or below, to find an increased effect of quenching, and a structural change in the resultant intermetallic compound. The present inventors also found that the state of dispersion of the intermetallic compound varied depending on the rotating speed of the dish-like disk. It was confirmed that, by setting the rotating speed of the dish-like disk to a high speed of approximately 100,000 rpm, the intermetallic compound that was formed by quenching accumulated at the surface portion, to thereby form a metal particle with an outer shell-like structure.

Figure 7:
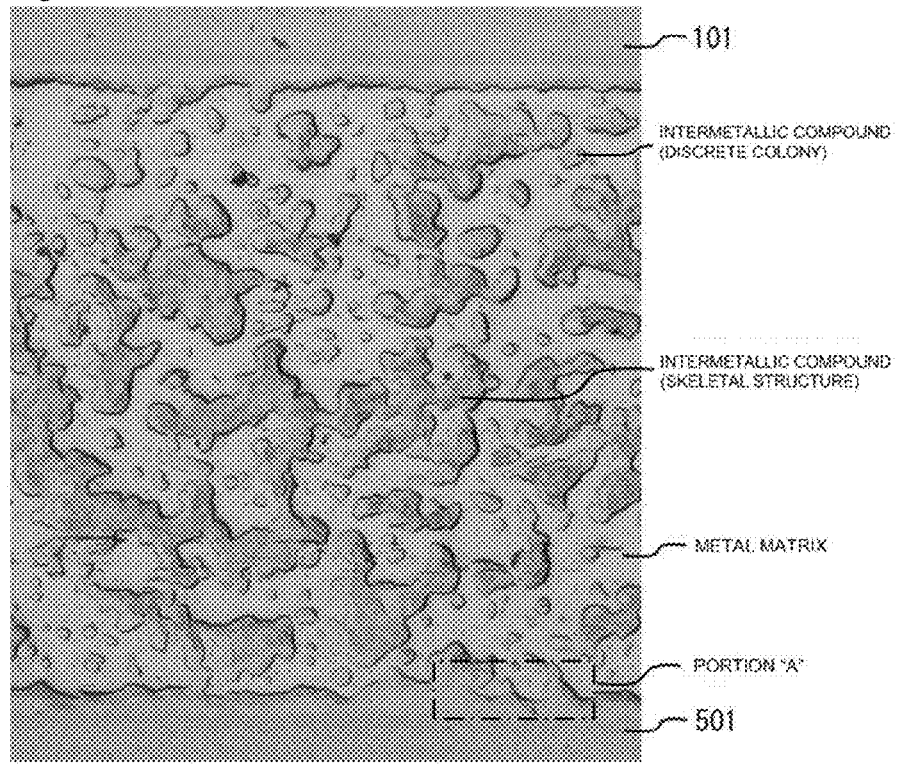
FIG. 7 is a SEM image of mainly portion "B" in FIG. 3.

The bonding portion that was formed by using the second metal, manufactured by the method described above, is shown in FIG. 7, which is a SEM image of the bonding portion illustrated in FIG. 3. Portion "B" in FIG. 3 corresponds to the layer 303 in FIG. 5. In FIG. 7, the intermetallic compound is observed to grow not only into the form of discrete colony, but also into the form of branch (shape like a branch-like coral), or dendrite, or island, so as to form a skeleton-like structure (referred to as a skeletal structure, hereinafter) that supports the bonding portion as a whole. It is also seen that the metal matrix fills up the gaps around the skeletal structure. Such skeletal structure is not observed when an alloy, manufactured by generally known methods such as atomization, is used.

As a result of containing not only the intermetallic compound in the form of discrete colony, but also the intermetallic compound having the skeletal structure as described above, the bonding portion 300 now has an enhanced bonding strength. Also owing to that the metal matrix having a high toughness fills up the gaps around the skeletal structure, the bonding portion 300 can also have a good flexibility.

Each preform sheet bonds with the adjoining preform sheet, typically based on diffusion bonding.

Metal components in the multi-layer preform sheet of this invention is selectable depending on purposes and applications. The multi-layer preform sheet is specifically composed of a metal element selected from Cu, Al, Ni, Sn, Ag, Au, Pt, Pd, Si, B, Ti, Bi, In, Sb, Ga, Zn, Fe, Ge, Mn, Cr and Co.

Figure 8:
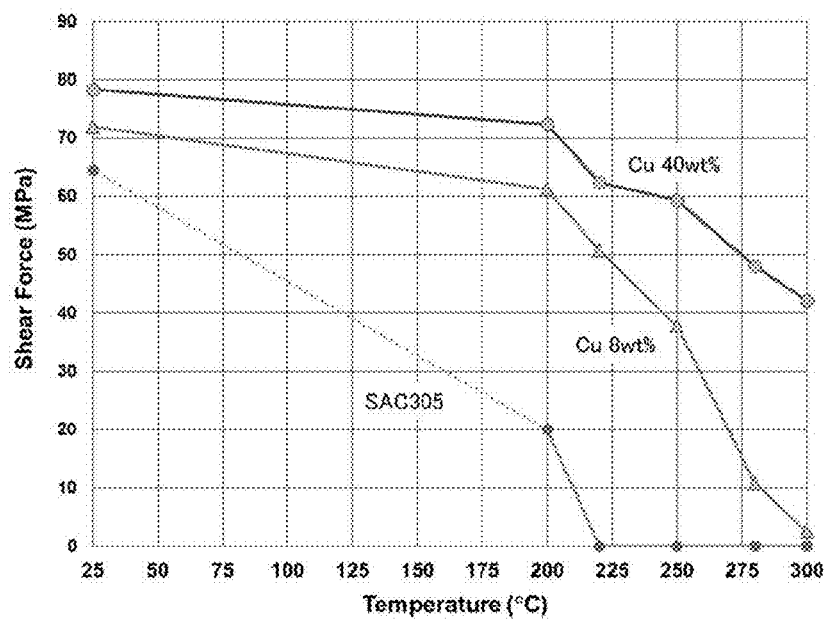
FIG. 8 is a graph illustrating shear force of a bonding portion formed with the multi-layer preform sheet of this invention.

FIG. 8 shows results of measurement of shear force of the bonding portion formed by using the multi-layer preform sheet of this invention. The shear force was measured using two types of multi-layer preform sheet having different Cu contents (8% by weight and 40% by weight). As a comparative example, FIG. 8 also shows a measured result of shear force of a bonding portion formed by using SAC305 (Sn—3.0% Ag—0.5% Cu). When SAC305 was used, the shear force was found to degrade as early as at 200° C., and dropped to zero at 225° C., meaning that the state of bonding was no more sustainable.

In contrast, the bonding portions formed by using the multi-layer preform sheet of this invention were found to keep sufficient levels of shear force at 200° C. Both samples were found to still keep the strength at 225° C. although with some difference arisen from the Cu content. At still higher temperatures, the strength was found to sharply fall in the 8%-by-weight bonding portion, but was kept at a sufficient level in the 40%-by-weight bonding portion. In short, by properly selecting the Cu content according to the environment of use, it is now possible to form the bonding portion capable of keeping a sufficient level of bonding strength even at high temperatures, which has been difficult to achieve with the conventional bonding member.

For reference, the present inventors have found in our high temperature storage (HTS) test at 260° C. that the shear force increased from approximately 35 MPa to approximately 40 MPa over the period from the start of test up to approximately 100 hours after, and was stabilized at around 40 MPa over the period up to 500 hours after.

The present inventors have also found from our thermal cycle test (TCT) over the range from −40 to 200° C., that the shear strength was stabilized approximately at 35 MPa at around the 200th cycle, and was kept thereafter at that level over the entire cycles (1000 cycles).

Figure 9:
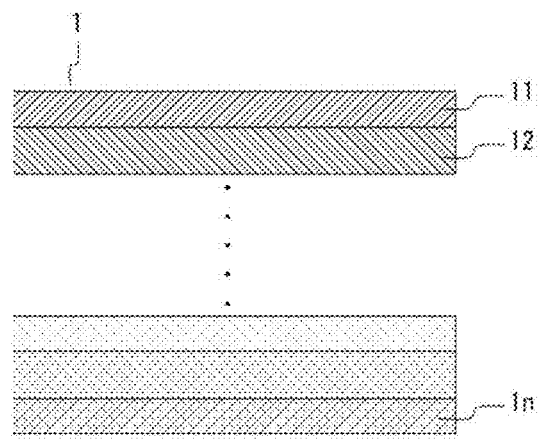
FIG. 9 is a schematic drawing illustrating another example of the multi-layer preform sheet of this invention.

FIG. 9 is a schematic drawing illustrating another example of the multi-layer preform sheet of this invention. A plural number (n) of the preform sheets (11, 12, . . . 1n) may be laminated depending on purposes of use or applications.

Figure 11:
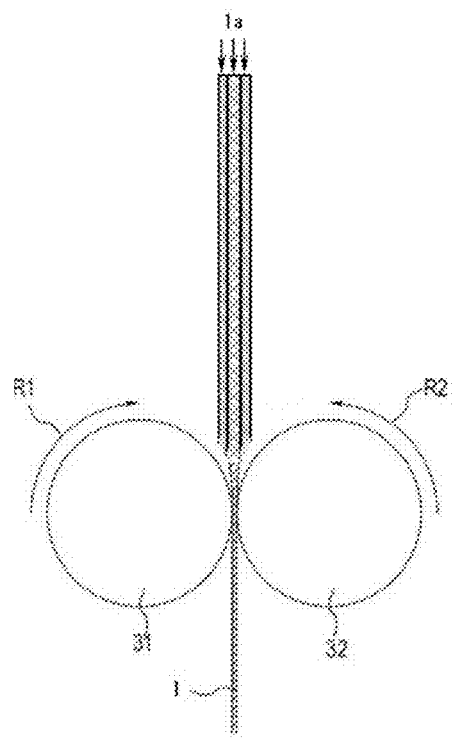
FIG. 11 is a schematic drawing illustrating a method of manufacturing the multi-layer preform sheet by rolling.

A preform sheet 1a of this invention may typically be obtained by powder rolling by which a metal powder is made into a sheet by a rolling process. The powder rolling per se has been implemented in various ways, and any of these known methods is applicable to this invention. FIG. 10 and FIG. 11 illustrate typical examples of application. In the example illustrated in FIG. 10, a metal powder 4 is fed between rolling mill rolls 31, 32 that rotate in counter directions R1, R2, and then pressurized by the rolling mill rolls 31, 32, to be output in the form of preform sheet 1a. In the example illustrated in FIG. 11, a plurality of preform sheets 1a are laminated and further rolled, to be output in the form of multi-layer preform sheet 1. The thickness of the individual preform sheets and the total thickness of the multi-layer preform sheet are properly controlled depending of purposes of use or applications.

Having described this invention in detail referring to the attached drawings, this invention is by no means limited to the description. It is apparent that those skilled in the art can contemplate a variety of modifications based on the basic technical spirit and teaching of this invention.

DESCRIPTION OF REFERENCE NUMERALS

1 multi-layer preform sheet
1*a* preform sheet
11 first layer
12 second layer
13 third layer
1*n* nth layer
100, 500 substrate
101, 501 member to be bonded
300 bonding portion
4 metal powder
31, 32 rolling mill roll

What is claimed is:

1. A multi-layer preform sheet comprising at least a first layer and a second layer,
   the first layer being mainly composed of Sn or Sn alloy, and containing at least 2% by weight of an intermetallic compound of Cu and Sn,
   the first layer being intended for taking part in bonding,
   the second layer containing a first metal and a second metal,
   the first metal being Cu or Cu alloy, and the second metal being a Sn alloy, and
   the second metal being an alloy is a formed metal particle comprising an intermetallic compound dispersed in the metal particle and forming an outer shell structure on the metal particle.

* * * * *